(12) United States Patent
Han

(10) Patent No.: US 10,090,336 B2
(45) Date of Patent: Oct. 2, 2018

(54) TFT SUBSTRATE, DISPLAY DEVICE AND MANUFACTURING METHOD

(71) Applicant: Shenzhen China Star Optoelectronics Technology Co., Ltd., Shenzhen, Guangdong (CN)

(72) Inventor: Baixiang Han, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 249 days.

(21) Appl. No.: 15/023,406

(22) PCT Filed: Feb. 26, 2016

(86) PCT No.: PCT/CN2016/074632
§ 371 (c)(1),
(2) Date: Mar. 21, 2016

(87) PCT Pub. No.: WO2017/128473
PCT Pub. Date: Aug. 3, 2017

(65) Prior Publication Data
US 2018/0040646 A1    Feb. 8, 2018

(30) Foreign Application Priority Data

Jan. 27, 2016    (CN) .......................... 2016 1 0057342

(51) Int. Cl.
*H01L 27/12*        (2006.01)
*H01L 29/417*       (2006.01)
*H01L 29/423*       (2006.01)

(52) U.S. Cl.
CPC ........ *H01L 27/1251* (2013.01); *H01L 27/127* (2013.01); *H01L 27/1237* (2013.01); *H01L 29/41733* (2013.01); *H01L 29/42384* (2013.01)

(58) Field of Classification Search
CPC . H01L 27/127; H01L 27/1251; H01L 27/237; H01L 25/41733; H01L 29/42384
See application file for complete search history.

(56) References Cited

U.S. PATENT DOCUMENTS 9,305,941 B2    4/2016  Chang et al.
2006/0290828 A1*  12/2006  Hwang ............... H01L 27/3244
                                                          349/43

(Continued)

FOREIGN PATENT DOCUMENTS

CN        202196957 U    3/2013
CN        104576744 A    4/2015

*Primary Examiner* — Phuc Dang
(74) *Attorney, Agent, or Firm* — Andrew C. Cheng

(57) ABSTRACT

A TFT substrate, a display device and a manufacturing method are disclosed. The TFT substrate includes a substrate and a first TFT structure and a second TFT structure formed on the substrate. The first TFT structure includes a first gate pattern and a first semiconductor pattern. The first semiconductor pattern is divided into a first channel region, and a first doping region and a second doping region located at two sides of the first channel region. The first channel region is disposed corresponding to the first gate pattern to form a first conductive channel under the function of first gate pattern. The first doping region is extended inside the second TFT structure as a second gate pattern of the second TFT structure. The present invention uses doping drain of a switching TFT as gate of a driving TFT to save layout space, and beneficial for realization of higher PPI.

8 Claims, 6 Drawing Sheets

(56) References Cited

U.S. PATENT DOCUMENTS

| | | | |
|---|---|---|---|
| 2007/0007524 A1 | 1/2007 | You et al. | |
| 2010/0237352 A1* | 9/2010 | Sele | H01L 27/12 257/66 |
| 2011/0049523 A1 | 3/2011 | Choi et al. | |
| 2011/0073918 A1* | 3/2011 | Makita | H01L 27/12 257/255 |
| 2013/0001564 A1 | 1/2013 | Choi et al. | |
| 2014/0225075 A1* | 8/2014 | Zhan | H01L 29/78672 257/40 |
| 2016/0035755 A1 | 2/2016 | Li et al. | |

* cited by examiner

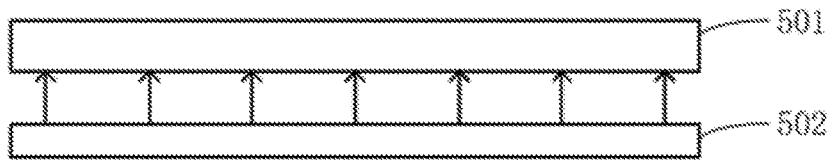

FIG 5

S61 — forming a first gate pattern and a first semiconductor pattern of a first TFT structure, wherein, the first semiconductor pattern is divided into a first channel region, and a first doping region and a second doping region located at two sides of the first channel region, wherein, the first channel region is disposed corresponding to the first gate pattern S62 — forming a second semiconductor pattern of a second TFT structure, wherein, the second semiconductor pattern is divided into a second channel region, and a third doping region and a fourth doping region which are located at two sides of the second channel region, the second channel region is disposed corresponding to the first doping region such that the first doping region functions as a second gate pattern of the second TFT structure

FIG 6

TFT SUBSTRATE, DISPLAY DEVICE AND MANUFACTURING METHOD

BACKGROUND OF THE INVENTION

1. Field of the Invention

The present invention relates to a display technology field, and more particularly to a TFT substrate, a display device and a manufacturing method.

2. Description of Related Art

In the display technology field, flat display technologies such as the Liquid Crystal Display (LCD) and Organic Light Emitting Diode (OLED) have gradually replaced the CRT display. Wherein, the OLED has many advantages of self-luminous, low driving voltage, high luminous efficiency, short response time, high contrast and clarity, near 180° viewing angle, a wide usage temperature range, capable of achieving flexible display and full color display in large area so that the industry accept that the OLED is the most development potential display device.

The circuit structure of the AMOLED usually requires two TFTs, wherein a drain electrode of a switching TFT of the two TFTs functions as a gate electrode of a second driving TFT of the two TFTs. A traditional layout usually realizes the above through a transferring layer. However, through a metal bridge transferring layer usually occupies a layout space. Along with a competition of high PPI (Pixels per inch), the traditional circuit design cannot meet a higher requirement for a higher PPI.

SUMMARY OF THE INVENTION

The main technology problem solved by the present invention is to provide a TFT substrate, a display device and a manufacturing method, which can save the layout space, and be beneficial for a realization of higher PPI.

In order to solve the above technology problem, the present invention provides a TFT substrate, comprising: a substrate; and a first TFT structure and a second TFT structure formed on the substrate; wherein, the first TFT structure includes a first gate pattern and a first semiconductor pattern, the first semiconductor pattern is divided into a first channel region, and a first doping region and a second doping region located at two sides of the first channel region, wherein, the first channel region is disposed corresponding to the first gate pattern so as to form a first conductive channel under the function of the first gate pattern, and the first doping region is extended to and inside the second TFT structure and functions as a second gate pattern of the second TFT structure.

Wherein, the second TFT structure includes a second semiconductor pattern, the second semiconductor pattern is divided into a second channel region, and a third doping region and a fourth doping region which are located at two sides of the second channel region, the second channel region is disposed corresponding to a portion of the first doping region extended to and inside the second TFT structure so as to form a second conductive channel under the function of the first doping region.

Wherein, the first channel region and the first gate pattern are partially overlapped, the second channel region and the portion of the first doping region extended to and inside the second TFT structure are partially overlapped.

Wherein, the first semiconductor pattern and the second semiconductor pattern are perpendicular to each other at a length direction such that projections of the third doping region and the fourth doping region projected on the substrate are respectively located at two sides of a projection of the first doping region projected on the substrate.

Wherein, the gate pattern is located between the substrate and the first semiconductor pattern, the first TFT structure and the second TFT structure further include a first insulation layer for separating the first gate pattern and the first semiconductor pattern, a second insulation layer for separating the first semiconductor pattern and the second semiconductor pattern, and a third insulation layer for covering the second semiconductor pattern and the second insulation layer;

the first TFT structure further includes a first source/drain pattern formed on the third insulation layer, the first TFT structure further provides with a first via hole which penetrates through the third insulation layer and the second insulation layer, and the first source/drain pattern is electrically connected with the second doping region through the first via hole; and the second TFT structure further includes a second source/drain pattern and a third source/drain pattern formed on the third insulation layer, the second TFT structure further includes a second via hole and a third via hole which penetrate the third insulation layer, the second source/drain pattern and the third source/drain pattern are electrically connected with the third doping region and the fourth doping region respectively through the second via hole and the third via hole.

Wherein, the first gate pattern is located at a side of the first semiconductor pattern away from the substrate, the first TFT structure and the second TFT structure further include a first insulation layer for separating the first gate pattern and the first semiconductor pattern, a second insulation layer for separating the first gate pattern and the second semiconductor pattern, and a third insulation layer for covering the second semiconductor pattern and the second insulation layer;

the first TFT structure further includes a first source/drain pattern formed on the third insulation layer, the first TFT structure further provides with a first via hole which penetrates through the third insulation layer, the second insulation layer and the first insulation layer, the first source/drain pattern is electrically connected with the second doping region through the first via hole; and the second TFT structure further includes a second source/drain pattern and a third source/drain pattern formed on the third insulation layer, the second TFT structure further includes a second via hole and a third via hole which penetrate the third insulation layer, the second source/drain pattern and the third source/drain pattern are electrically connected with the third doping region and the fourth doping region respectively through the second via hole and the third via hole.

The present invention also provides a display device, wherein, the display device includes a TFT substrate, and the TFT substrate comprises: a substrate; and a first TFT structure and a second TFT structure formed on the substrate; wherein, the first TFT structure includes a first gate pattern and a first semiconductor pattern, the first semiconductor pattern is divided into a first channel region, and a first doping region and a second doping region located at two sides of the first channel region, wherein, the first channel region is disposed corresponding to the first gate pattern so as to form a first conductive channel under the function of the first gate pattern, and the first doping region is extended to and inside the second TFT structure and functions as a second gate pattern of the second TFT structure.

Wherein, the second TFT structure includes a second semiconductor pattern, the second semiconductor pattern is divided into a second channel region, and a third doping region and a fourth doping region which are located at two sides of the second channel region, the second channel region is disposed corresponding to a portion of the first doping region extended to and inside the second TFT structure so as to form a second conductive channel under the function of the first doping region.

Wherein, the first channel region and the first gate pattern are partially overlapped, the second channel region and the portion of the first doping region extended to and inside the second TFT structure are partially overlapped.

Wherein, the first semiconductor pattern and the second semiconductor pattern are perpendicular to each other at a length direction such that projections of the third doping region and the fourth doping region projected on the substrate are respectively located at two sides of a projection of the first doping region projected on the substrate.

Wherein, the gate pattern is located between the substrate and the first semiconductor pattern, the first TFT structure and the second TFT structure further include a first insulation layer for separating the first gate pattern and the first semiconductor pattern, a second insulation layer for separating the first semiconductor pattern and the second semiconductor pattern, and a third insulation layer for covering the second semiconductor pattern and the second insulation layer;

the first TFT structure further includes a first source/drain pattern formed on the third insulation layer, the first TFT structure further provides with a first via hole which penetrates through the third insulation layer and the second insulation layer, and the first source/drain pattern is electrically connected with the second doping region through the first via hole; and the second TFT structure further includes a second source/drain pattern and a third source/drain pattern formed on the third insulation layer, the second TFT structure further includes a second via hole and a third via hole which penetrate the third insulation layer, the second source/drain pattern and the third source/drain pattern are electrically connected with the third doping region and the fourth doping region respectively through the second via hole and the third via hole.

Wherein, the first gate pattern is located at a side of the first semiconductor pattern away from the substrate, the first TFT structure and the second TFT structure further include a first insulation layer for separating the first gate pattern and the first semiconductor pattern, a second insulation layer for separating the first gate pattern and the second semiconductor pattern, and a third insulation layer for covering the second semiconductor pattern and the second insulation layer;

the first TFT structure further includes a first source/drain pattern formed on the third insulation layer, the first TFT structure further provides with a first via hole which penetrates through the third insulation layer, the second insulation layer and the first insulation layer, the first source/drain pattern is electrically connected with the second doping region through the first via hole; and the second TFT structure further includes a second source/drain pattern and a third source/drain pattern formed on the third insulation layer, the second TFT structure further includes a second via hole and a third via hole which penetrate the third insulation layer, the second source/drain pattern and the third source/drain pattern are electrically connected with the third doping region and the fourth doping region respectively through the second via hole and the third via hole.

In order to solve the above problems, the present invention also provides a manufacturing method for a TFT substrate, wherein, the manufacturing method comprises following steps:

forming a first gate pattern and a first semiconductor pattern of a first TFT structure, wherein, the first semiconductor pattern is divided into a first channel region, and a first doping region and a second doping region located at two sides of the first channel region, wherein, the first channel region is disposed corresponding to the first gate pattern; and forming a second semiconductor pattern of a second TFT structure, wherein, the second semiconductor pattern is divided into a second channel region, and a third doping region and a fourth doping region which are located at two sides of the second channel region, the second channel region is disposed corresponding to the first doping region such that the first doping region functions as a second gate pattern of the second TFT structure.

Wherein, the step of forming a first gate pattern and a first semiconductor pattern of a first TFT structure comprises:

forming the first gate pattern between a substrate and the first semiconductor pattern, forming a first insulation layer for separating the first gate pattern and the first semiconductor pattern, and forming a second insulation layer for separating the first semiconductor pattern and the second semiconductor pattern;

the step of forming a second semiconductor pattern of a second TFT structure comprises:

forming a third insulation layer for covering the second semiconductor pattern and the second insulation layer;

forming a first via hole which penetrates through the third insulation layer and the second insulation layer, and forming a second via hole and a third via hole which penetrate the third insulation layer; and forming a first source/drain pattern, a second source/drain pattern and a third source/drain pattern on the third insulation layer such that the first source/drain pattern is electrically connected with the second doping region through the first via hole, the second source/drain pattern and the third source/drain pattern are electrically connected with the third doping region and the fourth doping region respectively through the second via hole and the third via hole.

Wherein, the step of forming a first gate pattern and a first semiconductor pattern of a first TFT structure comprises:

forming the first gate pattern at a side of the first semiconductor pattern away from a substrate, forming a first insulation layer for separating the first gate pattern and the first semiconductor pattern, and forming a second insulation layer for separating the first semiconductor pattern and the second semiconductor pattern;

the step of forming a second semiconductor pattern of a second TFT structure comprises:

forming a third insulation layer for covering the second semiconductor pattern and the second insulation layer;

forming a first via hole which penetrates through the third insulation layer, the second insulation layer, and the third insulation layer, and forming a second via hole and a third via hole which penetrate the third insulation layer; and forming a first source/drain pattern, a second source/drain pattern and a third source/drain pattern on the third insulation layer such that the first source/drain pattern is electrically connected with the second doping region through the first via hole, the second source/drain pattern and the third source/drain pattern are electrically connected with the third doping region and the fourth doping region respectively through the second via hole and the third via hole.

The beneficial effect of the present invention is: comparing with the conventional art, the TFT substrate, the display device and the manufacturing method, through using doping drain of a switching TFT as gate of a driving TFT to save layout space, and beneficial for realization of higher PPI.

BRIEF DESCRIPTION OF THE DRAWINGS

FIG. 5 is a schematic structure diagram of an embodiment of a display device of the present invention;

FIG. 6 is a flow chart of a first embodiment of a manufacturing method for a TFT substrate of the present invention;

DETAILED DESCRIPTION OF THE PREFERRED EMBODIMENT

In order to further describe the technology solution and the effect adopted by the present invention, the following will combine the embodiments and drawings for describe the present invention in detail.

Figure 1:
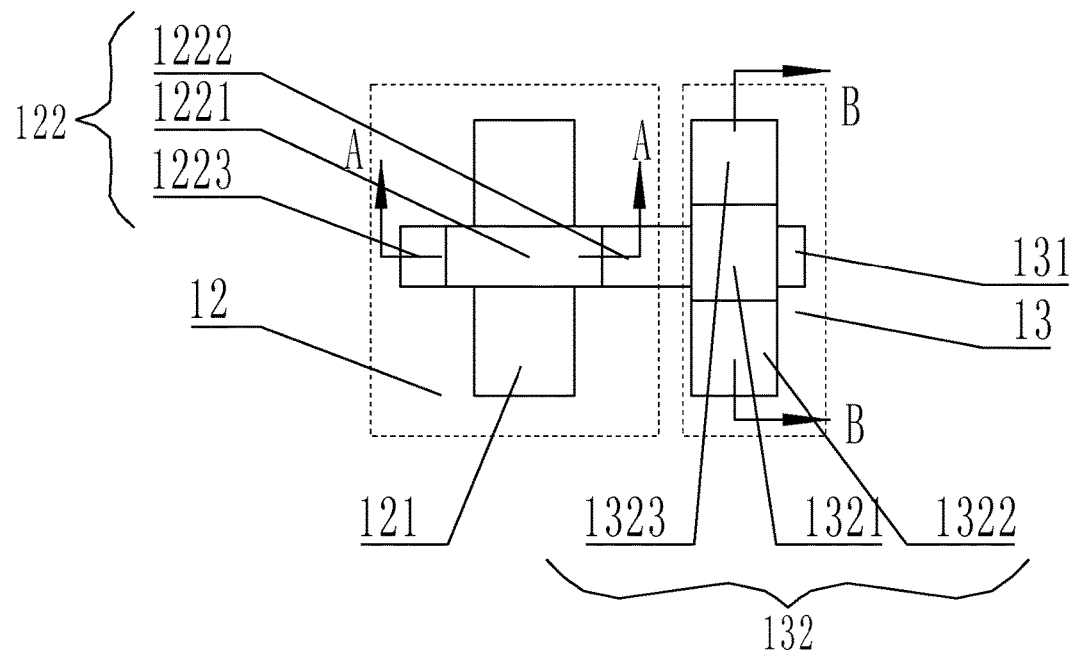
FIG. 1 is a schematic top view structure of a TFT substrate of a first embodiment of the present invention.
Figure 2:
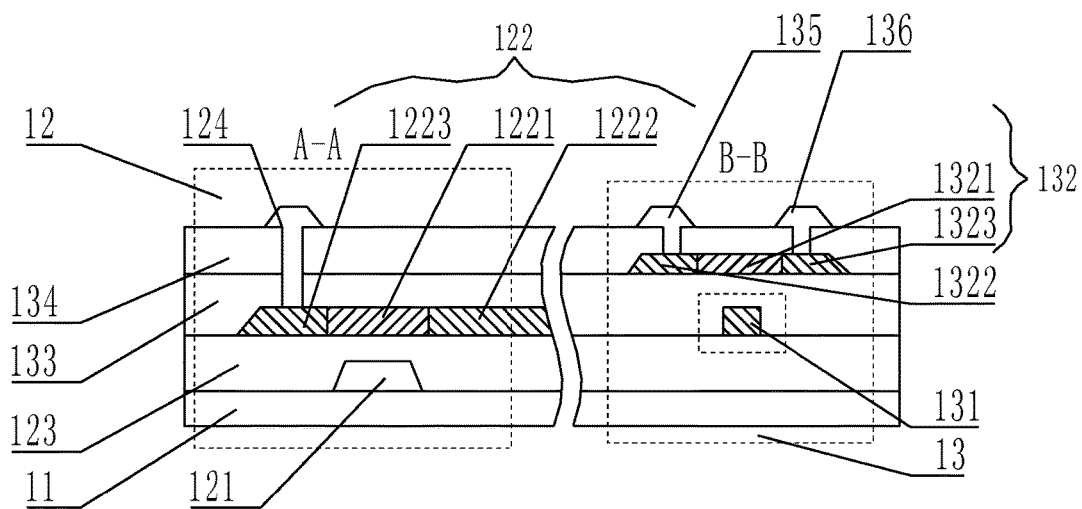
FIG. 2 is a schematic structure diagram of an A-A cross section and a B-B cross section of the schematic top view structure of the TFT substrate of the first embodiment of the present invention.

With reference to FIG. 1, and FIG. 1 is a schematic top view structure of a TFT substrate of a first embodiment of the present invention. With reference to FIG. 2 is a schematic structure diagram of an A-A cross section and a B-B cross section of the schematic top view structure of the TFT substrate of the first embodiment of the present invention. In the present embodiment, the embodiment includes a substrate 11, a first TFT structure 12 and a second TFT structure 13 which are formed on the substrate 11. Wherein, the first TFT structure 12 includes a first gate pattern 121 and a first semiconductor pattern 122. The first semiconductor pattern 122 is divided into a first channel region 1221 and a first doping region 1222 and a second doping region 1223 located at two sides of the first channel region 1221. Wherein, the first channel region 1221 is disposed corresponding to the first gate pattern 121 so as to form a first conductive channel under the function of the first gate pattern 121. The first doping region 1222 is extended to and inside the second TFT structure 13 and functions as a second gate pattern 131 of the second TFT structure 13.

Wherein, the second TFT structure 13 includes a second semiconductor pattern 132. The second semiconductor pattern 132 is divided into a second channel region 1321 and a third doping region 1322 and a fourth doping region 1323 which are located at two sides of the second channel region 1321. The second channel region 1321 is disposed corresponding to a portion of the first doping region 1222 extended to and inside the second TFT structure 13 so as to form a second conductive channel under the function of the first doping region 1222.

Wherein, the first channel region 1221 and the first gate pattern 121 are partially overlapped. The second channel region 1321 and the portion of the first doping region 1222 extended to and inside the second TFT structure 13 are partially overlapped.

With reference to FIG. 1, the first semiconductor pattern 122 and the second semiconductor pattern 132 are perpendicular to each other at a length direction such that projections of the third doping region 1322 and the fourth doping region 1323 projected on the substrate 11 are respectively located at two sides of a projection of the first doping region 1222 projected on the substrate 11.

Wherein, the gate pattern 121 is located between the substrate 11 and the first semiconductor pattern 122. The first TFT structure 12 and the second TFT structure 13 further include a first insulation layer 123 for separating the first gate pattern 121 and the first semiconductor pattern 122, a second insulation layer 133 for separating the first semiconductor pattern 122 and the second semiconductor pattern 132, and a third insulation layer 134 for covering the second semiconductor pattern 132 and the second insulation layer 133.

The first TFT structure 12 further includes a first source/drain pattern 124 formed on the third insulation layer 134, the first TFT structure 12 further provides with a first via hole which penetrates through the third insulation layer and the second insulation layer. The first source/drain pattern 124 is electrically connected with the second doping region 1223 through the first via hole.

The second TFT structure 13 further includes a second source/drain pattern 135 and a third source/drain pattern 136 formed on the third insulation layer 134; the second TFT structure 13 further includes a second via hole and a third via hole which penetrate the third insulation layer. The second source/drain pattern 135 and the third source/drain pattern 136 are electrically connected with the third doping region 1322 and the fourth doping region 1323 respectively through the second via hole and the third via hole.

Wherein, the substrate 11 can be a glass substrate, a material of the first gate pattern 121 can be copper, aluminum or molybdenum, a material of the insulation layer can be silicon oxide or silicon nitride, and the first semiconductor pattern 122 and the second semiconductor pattern 132 can be metal oxide.

In the first embodiment of the TFT substrate of the present invention, through a layout method that extending the first doping region 1222 of the first TFT structure 12 to and inside the second TFT structure 13, and functioning as the second gate pattern 131 of the second TFT structure 13, saving the layout space, and beneficial for a realization of higher PPI.

Figure 3:
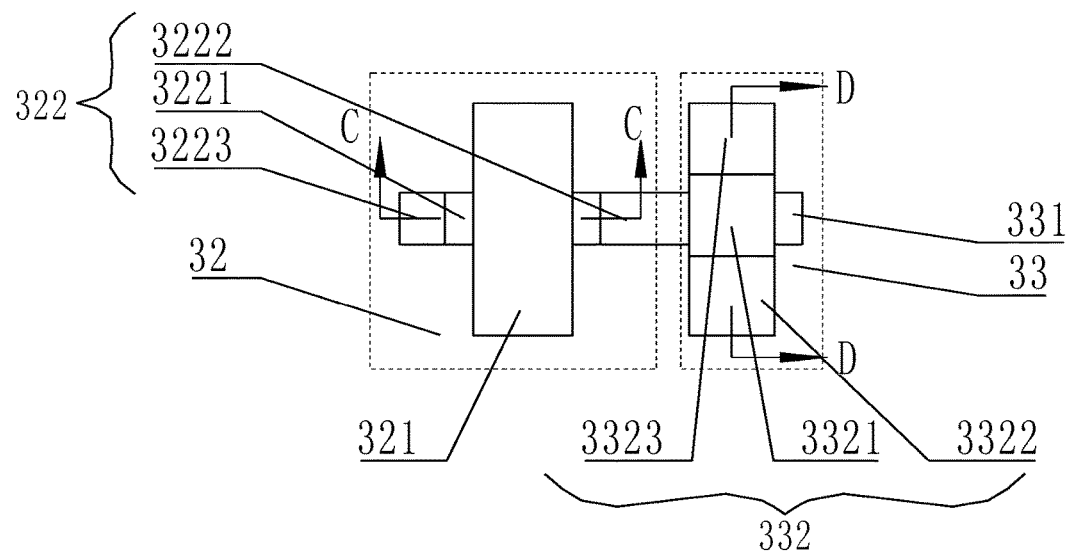
FIG. 3 is a schematic top view structure of a TFT substrate of a second embodiment of the present invention.

With reference to FIG. 3, and FIG. 3 is a schematic top view structure of a TFT substrate of a second embodiment of the present invention. In the present embodiment, the embodiment includes a substrate 31, a first TFT structure 32 and a second TFT structure 33 which are formed on the substrate 31. Wherein, the first TFT structure 32 includes a first gate pattern 321 and a first semiconductor pattern 322. The first semiconductor pattern 322 is divided into a first channel region 3221 and a first doping region 3222 and a second doping region 3223 located at two sides of the first channel region 3221. Wherein, the first channel region 3221 is disposed corresponding to the first gate pattern 321 so as to form a first conductive channel under the function of the first gate pattern 321. The first doping region 3222 is extended to and inside the second TFT structure 33 and functions as a second gate pattern 331 of the second TFT structure 33.

Wherein, the second TFT structure 33 includes a second semiconductor pattern 332. The second semiconductor pattern 332 is divided into a second channel region 3321 and a third doping region 3322 and a fourth doping region 3323 which are located at two sides of the second channel region 3321. The second channel region 3321 is disposed corresponding to a portion of the first doping region 3222 extended to and inside the second TFT structure 33 so as to form a second conductive channel under the function of the first doping region 3222.

Wherein, the first channel region 3221 and the first gate pattern 321 are partially overlapped. The second channel region 3321 and the portion of the first doping region 3222 extended to and inside the second TFT structure 33 are partially overlapped.

Figure 4:
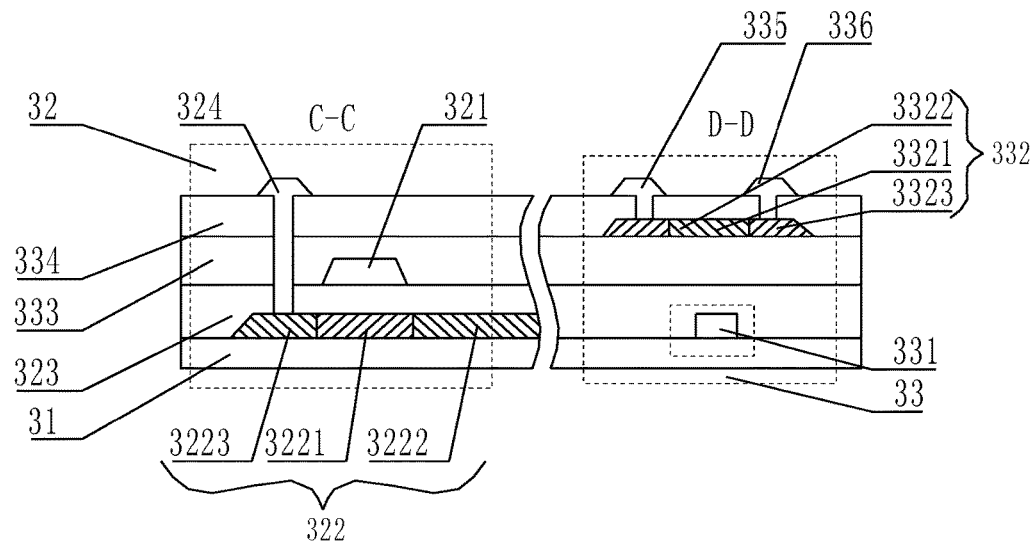
FIG. 4 is a schematic structure diagram of a C-C cross section and a D-D cross section of the schematic top view structure of the TFT substrate of the second embodiment of the present invention.

As shown in FIG. 4, and FIG. 4 is a schematic structure diagram of a C-C cross section and a D-D cross section of the schematic top view structure of the TFT substrate of the second embodiment of the present invention. the first semiconductor pattern 322 and the second semiconductor pattern 332 are perpendicular to each other at a length direction such that projections of the third doping region 3322 and the fourth doping region 3323 projected on the substrate 31 are respectively located at two sides of a projection of the first doping region 3222 projected on the substrate 31.

Wherein, the first gate pattern 321 is located at a side of the first semiconductor pattern 322 away from the substrate 31. The first TFT structure 32 and the second TFT structure 33 further include a first insulation layer 323 for separating the first gate pattern 321 and the first semiconductor pattern 322, a second insulation layer 333 for separating the first gate pattern 321 and the second semiconductor pattern 332, and a third insulation layer 334 for covering the second semiconductor pattern 332 and the second insulation layer 333.

The first TFT structure 32 further includes a first source/drain pattern 324 formed on the third insulation layer 334, the first TFT structure 32 further provides with a first via hole which penetrates through the third insulation layer 334, the second insulation layer 333 and the first insulation layer 323. The first source/drain pattern 324 is electrically connected with the second doping region 3223 through the first via hole.

The second TFT structure 33 further includes a second source/drain pattern 335 and a third source/drain pattern 336 formed on the third insulation layer 334; the second TFT structure 33 further includes a second via hole and a third via hole which penetrate the third insulation layer 334. The second source/drain pattern 335 and the third source/drain pattern 336 are electrically connected with the third doping region 3322 and the fourth doping region 3323 respectively through the second via hole and the third via hole.

In the second embodiment of the TFT substrate of the present invention, through a layout method that extending the first doping region 3222 of the first TFT structure 32 to and inside the second TFT structure 33, and functioning as the second gate pattern 331 of the second TFT structure 33, saving the layout space, and beneficial for a realization of higher PPI.

With reference to FIG. 5, and FIG. 5 is a schematic structure diagram of a display device of an embodiment of the present invention. The display device includes a display panel 510 and a backlight 502. The display panel 501 includes the above TFT substrate, and the specific embodiment way is similar, no more repeating.

With reference to FIG. 6, and FIG. 6 is a flow chart of a first embodiment of a manufacturing method for a TFT substrate of the present invention. In the present embodiment, the manufacturing method includes following steps:

S61, forming a first gate pattern and a first semiconductor pattern of a first TFT structure, wherein, the first semiconductor pattern is divided into a first channel region, and a first doping region and a second doping region located at two sides of the first channel region, wherein, the first channel region is disposed corresponding to the first gate pattern;

S62, forming a second semiconductor pattern of a second TFT structure, wherein, the second semiconductor pattern is divided into a second channel region, and a third doping region and a fourth doping region which are located at two sides of the second channel region, the second channel region is disposed corresponding to the first doping region such that the first doping region functions as a second gate pattern of the second TFT structure.

Wherein, a doping process for the doping regions can be an N-type heavy doping process. A deposition process of a semiconductor layer and a metal layer required to be deposited can be a physical vapor deposition or a chemical vapor deposition.

Figure 7:
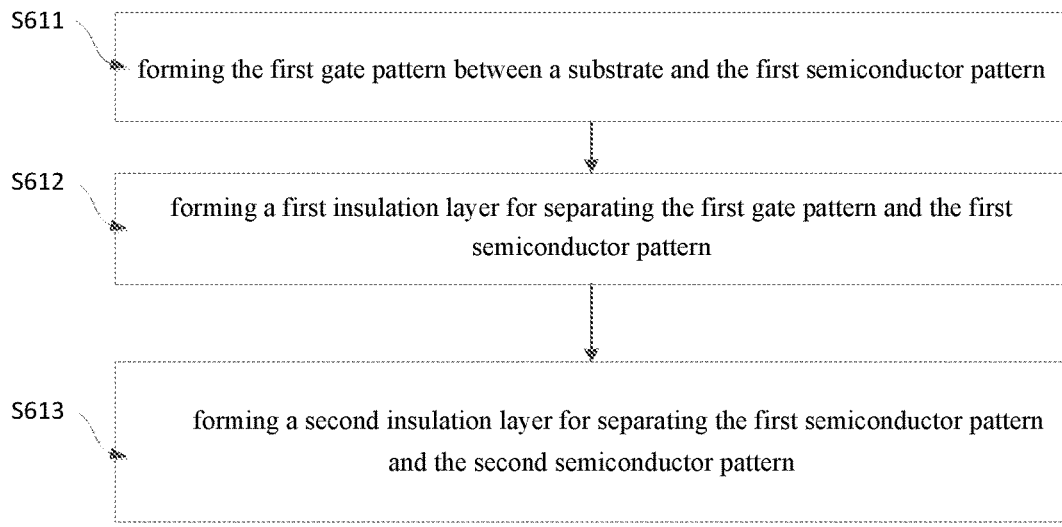
FIG. 7 is a flow chart of specific steps of the step S61 of the first embodiment of the manufacturing method for the TFT substrate of the present invention.
Figure 8:
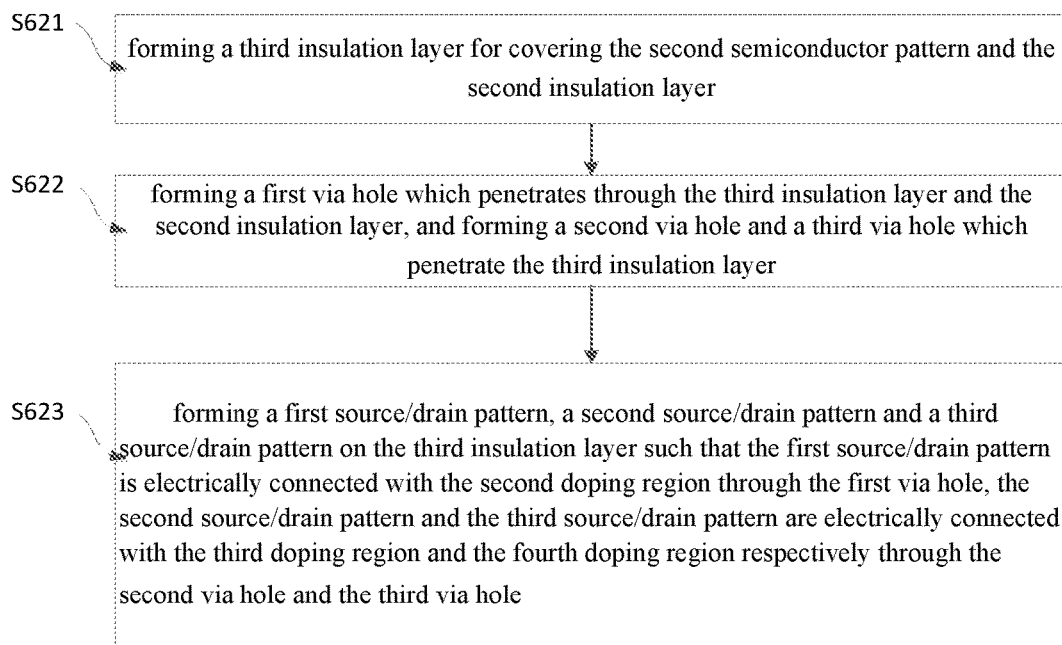
FIG. 8 is a flow chart of specific steps of the step S62 of the first embodiment of the manufacturing method for the TFT substrate of the present invention.

With reference to FIG. 7 and FIG. 8, respectively flow charts of specific steps of the steps S61 and S62.

The step S61 of forming a first gate pattern and a first semiconductor pattern of a first TFT structure includes:

S611, forming the first gate pattern between a substrate and the first semiconductor pattern;

S612, forming a first insulation layer for separating the first gate pattern and the first semiconductor pattern;

S613, forming a second insulation layer for separating the first semiconductor pattern and the second semiconductor pattern;

The step S62 of forming a second semiconductor pattern of a second TFT structure includes:

S621, forming a third insulation layer for covering the second semiconductor pattern and the second insulation layer;

S622, forming a first via hole which penetrates through the third insulation layer and the second insulation layer, and forming a second via hole and a third via hole which penetrate the third insulation layer;

S623, forming a first source/drain pattern, a second source/drain pattern and a third source/drain pattern on the third insulation layer such that the first source/drain pattern is electrically connected with the second doping region through the first via hole, the second source/drain pattern and the third source/drain pattern are electrically connected with the third doping region and the fourth doping region respectively through the second via hole and the third via hole.

Wherein, the method for forming the patterns can be a lithography process, including a photoresist coating, exposing, developing, wet etching and photoresist removing.

In the first embodiment of the manufacturing method for the TFT substrate of the present invention, through extending the first doping region of the first TFT structure to and inside the second TFT structure, and functioning as the second gate pattern of the second TFT structure, saving the layout space, and beneficial for a realization of higher PPI.

Figure 9:
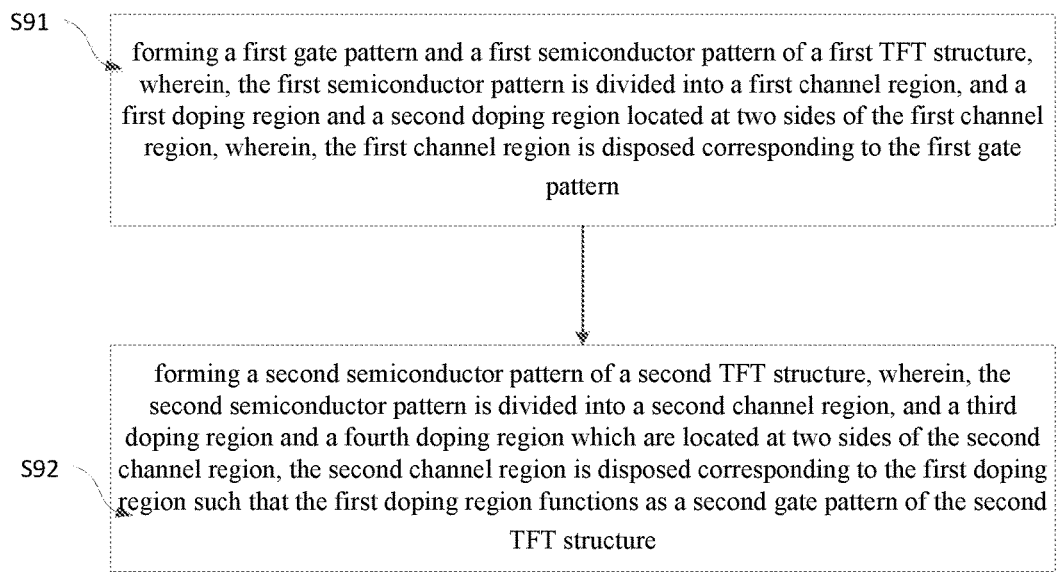
FIG. 9 is a flow chart of a second embodiment of a manufacturing method for a TFT substrate of the present invention.

With reference to FIG. 9, and FIG. 9 is a flow chart of a second embodiment of a manufacturing method for a TFT substrate of the present invention, the manufacturing method includes following steps:

S91, forming a first gate pattern and a first semiconductor pattern of a first TFT structure, wherein, the first semiconductor pattern is divided into a first channel region, and a first doping region and a second doping region located at two sides of the first channel region, wherein, the first channel region is disposed corresponding to the first gate pattern;

S92, forming a second semiconductor pattern of a second TFT structure, wherein, the second semiconductor pattern is divided into a second channel region, and a third doping region and a fourth doping region which are located at two sides of the second channel region, the second channel region is disposed corresponding to the first doping region such that the first doping region functions as a second gate pattern of the second TFT structure.

Wherein, a doping process for the doping regions can be an N-type heavy doping process. A deposition process of a semiconductor layer and a metal layer required to be deposited can be a physical vapor deposition or a chemical vapor deposition.

Figure 10:
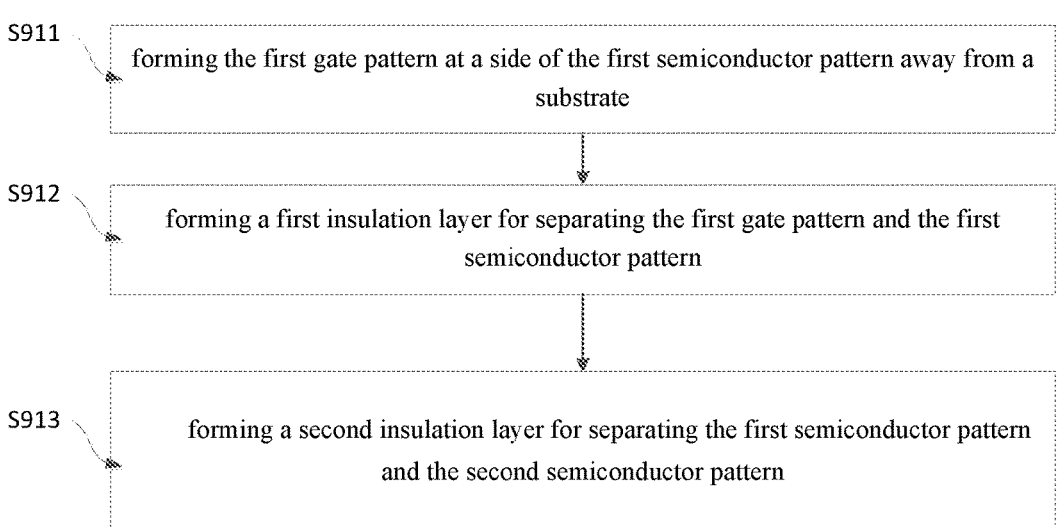
FIG. 10 is a flow chart of specific steps of the step S91 of the second embodiment of the manufacturing method for the TFT substrate of the present invention.
Figure 11:
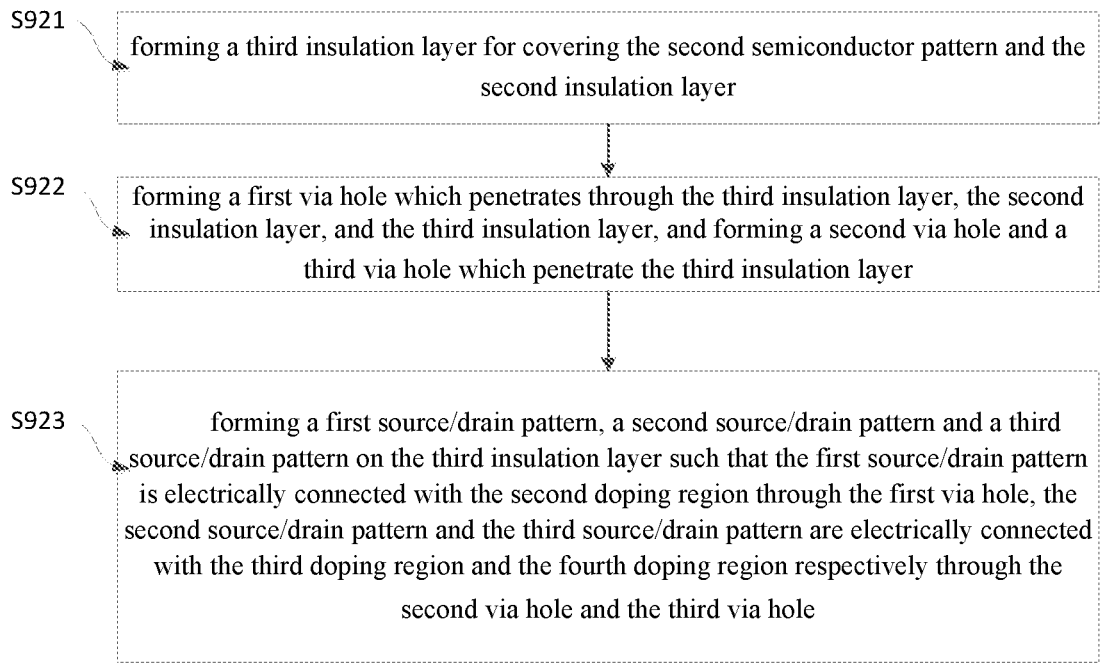
FIG. 11 is a flow chart of specific steps of the step S92 of the second embodiment of the manufacturing method for the TFT substrate of the present invention.

With reference to FIG. 10 and FIG. 11, respectively flow charts of specific steps of the steps S91 and S92 of the second embodiment of manufacturing method for the TFT substrate of the present invention.

The step S91 of forming a first gate pattern and a first semiconductor pattern of a first TFT structure includes:

S911, forming the first gate pattern at a side of the first semiconductor pattern away from a substrate;

S912, forming a first insulation layer for separating the first gate pattern and the first semiconductor pattern;

S913, forming a second insulation layer for separating the first semiconductor pattern and the second semiconductor pattern;

The step of forming a second semiconductor pattern of a second TFT structure includes:

S921, forming a third insulation layer for covering the second semiconductor pattern and the second insulation layer;

S922, forming a first via hole which penetrates through the third insulation layer, the second insulation layer, and the third insulation layer, and forming a second via hole and a third via hole which penetrate the third insulation layer;

S923, forming a first source/drain pattern, a second source/drain pattern and a third source/drain pattern on the third insulation layer such that the first source/drain pattern is electrically connected with the second doping region through the first via hole, the second source/drain pattern and the third source/drain pattern are electrically connected with the third doping region and the fourth doping region respectively through the second via hole and the third via hole.

In the second embodiment of the manufacturing method for the TFT substrate of the present invention, through extending the first doping region of the first TFT structure to and inside the second TFT structure, and functioning as the second gate pattern of the second TFT structure, saving the layout space, and beneficial for a realization of higher PPI.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A TFT substrate, comprising:
   a substrate; and
   a first TFT structure and a second TFT structure formed on the substrate;
   wherein the first TFT structure includes a first gate pattern and a first semiconductor pattern, the first semiconductor pattern is divided into a first channel region, and a first doping region and a second doping region located at two sides of the first channel region, wherein, the first channel region is disposed corresponding to the first gate pattern so as to form a first conductive channel under the function of the first gate pattern, and the first doping region is extended to and inside the second TFT structure and functions as a second gate pattern of the second TFT structure;
   wherein the second TFT structure includes a second semiconductor pattern, the second semiconductor pattern is divided into a second channel region, and a third doping region and a fourth doping region which are located at two sides of the second channel region, the second channel region is disposed corresponding to a portion of the first doping region extended to and inside the second TFT structure so as to form a second conductive channel under the function of the first doping region;
   wherein the first channel region and the first gate pattern are partially overlapped, the second channel region and the portion of the first doping region extended to and inside the second TFT structure are partially overlapped; and
   the first semiconductor pattern and the second semiconductor pattern are perpendicular to each other at a length direction such that projections of the third doping region and the fourth doping region projected on the substrate are respectively located at two sides of a projection of the first doping region projected on the substrate.

2. The TFT substrate according to claim 1, wherein the gate pattern is located between the substrate and the first semiconductor pattern, the first TFT structure and the second TFT structure further include a first insulation layer for separating the first gate pattern and the first semiconductor pattern, a second insulation layer for separating the first semiconductor pattern and the second semiconductor pattern, and a third insulation layer for covering the second semiconductor pattern and the second insulation layer;
   the first TFT structure further includes a first source/drain pattern formed on the third insulation layer, the first TFT structure further provides with a first via hole which penetrates through the third insulation layer and the second insulation layer, and the first source/drain pattern is electrically connected with the second doping region through the first via hole; and
   the second TFT structure further includes a second source/drain pattern and a third source/drain pattern formed on the third insulation layer, the second TFT structure further includes a second via hole and a third via hole which penetrate the third insulation layer, the second source/drain pattern and the third source/drain pattern are electrically connected with the third doping region and the fourth doping region respectively through the second via hole and the third via hole.

3. The TFT substrate according to claim 1, wherein the first gate pattern is located at a side of the first semiconductor pattern away from the substrate, the first TFT structure and the second TFT structure further include a first insulation layer for separating the first gate pattern and the first semiconductor pattern, a second insulation layer for separating the first gate pattern and the second semiconductor pattern, and a third insulation layer for covering the second semiconductor pattern and the second insulation layer;

the first TFT structure further includes a first source/drain pattern formed on the third insulation layer, the first TFT structure further provides with a first via hole which penetrates through the third insulation layer, the second insulation layer and the first insulation layer, the first source/drain pattern is electrically connected with the second doping region through the first via hole; and the second TFT structure further includes a second source/drain pattern and a third source/drain pattern formed on the third insulation layer, the second TFT structure further includes a second via hole and a third via hole which penetrate the third insulation layer, the second source/drain pattern and the third source/drain pattern are electrically connected with the third doping region and the fourth doping region respectively through the second via hole and the third via hole.

4. A display device, comprising a TFT substrate, which comprises:

a substrate; and a first TFT structure and a second TFT structure formed on the substrate;

wherein the first TFT structure includes a first gate pattern and a first semiconductor pattern, the first semiconductor pattern is divided into a first channel region, and a first doping region and a second doping region located at two sides of the first channel region, wherein, the first channel region is disposed corresponding to the first gate pattern so as to form a first conductive channel under the function of the first gate pattern, and the first doping region is extended to and inside the second TFT structure and functions as a second gate pattern of the second TFT structure;

wherein the second TFT structure includes a second semiconductor pattern, the second semiconductor pattern is divided into a second channel region, and a third doping region and a fourth doping region which are located at two sides of the second channel region, the second channel region is disposed corresponding to a portion of the first doping region extended to and inside the second TFT structure so as to form a second conductive channel under the function of the first doping region;

wherein the first channel region and the first gate pattern are partially overlapped, the second channel region and the portion of the first doping region extended to and inside the second TFT structure are partially overlapped; and wherein the first semiconductor pattern and the second semiconductor pattern are perpendicular to each other at a length direction such that projections of the third doping region and the fourth doping region projected on the substrate are respectively located at two sides of a projection of the first doping region projected on the substrate.

5. The display device according to claim 4, wherein the gate pattern is located between the substrate and the first semiconductor pattern, the first TFT structure and the second TFT structure further include a first insulation layer for separating the first gate pattern and the first semiconductor pattern, a second insulation layer for separating the first semiconductor pattern and the second semiconductor pattern, and a third insulation layer for covering the second semiconductor pattern and the second insulation layer;

the first TFT structure further includes a first source/drain pattern formed on the third insulation layer, the first TFT structure further provides with a first via hole which penetrates through the third insulation layer and the second insulation layer, and the first source/drain pattern is electrically connected with the second doping region through the first via hole; and the second TFT structure further includes a second source/drain pattern and a third source/drain pattern formed on the third insulation layer, the second TFT structure further includes a second via hole and a third via hole which penetrate the third insulation layer, the second source/drain pattern and the third source/drain pattern are electrically connected with the third doping region and the fourth doping region respectively through the second via hole and the third via hole.

6. The display device according to claim 4, wherein the first gate pattern is located at a side of the first semiconductor pattern away from the substrate, the first TFT structure and the second TFT structure further include a first insulation layer for separating the first gate pattern and the first semiconductor pattern, a second insulation layer for separating the first gate pattern and the second semiconductor pattern, and a third insulation layer for covering the second semiconductor pattern and the second insulation layer;

the first TFT structure further includes a first source/drain pattern formed on the third insulation layer, the first TFT structure further provides with a first via hole which penetrates through the third insulation layer, the second insulation layer and the first insulation layer, the first source/drain pattern is electrically connected with the second doping region through the first via hole; and the second TFT structure further includes a second source/drain pattern and a third source/drain pattern formed on the third insulation layer, the second TFT structure further includes a second via hole and a third via hole which penetrate the third insulation layer, the second source/drain pattern and the third source/drain pattern are electrically connected with the third doping region and the fourth doping region respectively through the second via hole and the third via hole.

7. A manufacturing method for a TFT substrate, comprising the following steps:

forming a first gate pattern and a first semiconductor pattern of a first TFT structure, wherein the first semiconductor pattern is divided into a first channel region, and a first doping region and a second doping region located at two sides of the first channel region, and wherein the first channel region is disposed corresponding to the first gate pattern; and forming a second semiconductor pattern of a second TFT structure, wherein the second semiconductor pattern is divided into a second channel region, and a third doping region and a fourth doping region which are located at two sides of the second channel region, and the second channel region is disposed corresponding to a portion of the first doping region such that the first doping region functions as a second gate pattern of the second TFT structure;

wherein the step of forming a first gate pattern and a first semiconductor pattern of a first TFT structure comprises:

forming the first gate pattern between a substrate and the first semiconductor pattern, forming a first insulation layer for separating the first gate pattern and the first semiconductor pattern, and forming a second insulation layer for separating the first semiconductor pattern and the second semiconductor pattern;

the step of forming a second semiconductor pattern of a second TFT structure comprises:

forming a third insulation layer for covering the second semiconductor pattern and the second insulation layer;

forming a first via hole which penetrates through the third insulation layer and the second insulation layer, and forming a second via hole and a third via hole which penetrate the third insulation layer; and forming a first source/drain pattern, a second source/drain pattern and a third source/drain pattern on the third insulation layer such that the first source/drain pattern is electrically connected with the second doping region through the first via hole, the second source/drain pattern and the third source/drain pattern are electrically connected with the third doping region and the fourth doping region respectively through the second via hole and the third via hole.

8. A manufacturing method for a TFT substrate, comprising the following steps:

forming a first gate pattern and a first semiconductor pattern of a first TFT structure, wherein, the first semiconductor pattern is divided into a first channel region, and a first doping region and a second doping region located at two sides of the first channel region, wherein, the first channel region is disposed corresponding to the first gate pattern; and forming a second semiconductor pattern of a second TFT structure, wherein, the second semiconductor pattern is divided into a second channel region, and a third doping region and a fourth doping region which are located at two sides of the second channel region, the second channel region is disposed corresponding to a portion of the first doping region such that the first doping region functions as a second gate pattern of the second TFT structure;

wherein the step of forming a first gate pattern and a first semiconductor pattern of a first TFT structure comprises:

forming the first gate pattern at a side of the first semiconductor pattern away from a substrate, forming a first insulation layer for separating the first gate pattern and the first semiconductor pattern, and forming a second insulation layer for separating the first semiconductor pattern and the second semiconductor pattern;

the step of forming a second semiconductor pattern of a second TFT structure comprises:

forming a third insulation layer for covering the second semiconductor pattern and the second insulation layer;

forming a first via hole which penetrates through the third insulation layer, the second insulation layer, and the third insulation layer, and forming a second via hole and a third via hole which penetrate the third insulation layer; and forming a first source/drain pattern, a second source/drain pattern and a third source/drain pattern on the third insulation layer such that the first source/drain pattern is electrically connected with the second doping region through the first via hole, the second source/drain pattern and the third source/drain pattern are electrically connected with the third doping region and the fourth doping region respectively through the second via hole and the third via hole.

* * * * *